United States Patent
Ohashi

(10) Patent No.: US 6,956,911 B2
(45) Date of Patent: Oct. 18, 2005

(54) RECEIVER

(75) Inventor: Toru Ohashi, Saitama (JP)

(73) Assignee: Pioneer Corporation, Tokyo (JP)

( * ) Notice: Subject to any disclaimer, the term of this patent is extended or adjusted under 35 U.S.C. 154(b) by 781 days.

(21) Appl. No.: 09/917,682

(22) Filed: Jul. 31, 2001

(65) Prior Publication Data

US 2002/0025007 A1 Feb. 28, 2002

(30) Foreign Application Priority Data

Jul. 31, 2000 (JP) ..................................... P. 2000-230356

(51) Int. Cl.⁷ .............................................. H03K 9/00
(52) U.S. Cl. ...................................................... 375/316
(58) Field of Search ................................. 375/316, 350, 375/355; 708/290, 300

(56) References Cited

U.S. PATENT DOCUMENTS

| | | | |
|---|---|---|---|
| 4,185,325 A | | 1/1980 | Appel |
| 5,396,489 A | * | 3/1995 | Harrison ..................... 370/210 |
| 5,422,909 A | | 6/1995 | Love et al. |
| 5,590,158 A | * | 12/1996 | Yamaguchi et al. ........ 375/331 |
| 5,673,044 A | | 9/1997 | Pellon |
| 5,768,311 A | * | 6/1998 | Betts et al. .................. 375/222 |
| 6,005,506 A | | 12/1999 | Bazarjani et al. |
| 6,072,538 A | * | 6/2000 | Keating ...................... 348/625 |
| 6,714,796 B1 | * | 3/2004 | Mizukoshi et al. ....... 455/550.1 |

OTHER PUBLICATIONS

Vladimir Friedman et al.., "A Bit–Slice Architecture for Sigma–Delta Analog-to-Digital Converters", IEEE Journal on Selected Areas in Communications., vol. 6, No. 3, Apr. 1988, pp. 520–526, XP002221642, IEEE Inc. New York., US.

* cited by examiner

Primary Examiner—Khai Tran
(74) Attorney, Agent, or Firm—Sughrue Mion, PLLC

(57) ABSTRACT

Such a digital receiver comprises a digital band-pass filter 16 for performing digital filtering on digital data $D_{IF}$ of the intermediate frequency, the digital data $D_{IF}$ frequency-converted by a frequency converter and undergone analog-to-digital conversion, at a first sampling rate equal to an exponentiation multiple of 2 of the intermediate frequency, and an interpolation filter 17 for performing digital filtering on digital data $D_{BF}$ output from the digital band-pass filter 16 at a second sampling rate equal to an exponentiation multiple of 2 of the intermediate frequency and outputting the resulting data to a detection circuit 18.

26 Claims, 13 Drawing Sheets

(PHASES MATCH BETWEEN THE CARRIER WAVE AND THE SAMPLING POINTS)

(PHASES ARE DISLOCATED FROM EACH OTHER BETWEEN THE CARRIER WAVE AND THE SAMPLING POINTS)

RECEIVER

BACKGROUND OF THE INVENTION

1. Field of the Invention

The present invention relates to a receiver for regenerating a signal wave from a received wave, and in particular to a receiver for regenerating a signal wave via digital signal processing.

2. Related Art

Conventionally, an analog receiver of the superheterodyne system is known as a receiver for receiving a broadcast wave transmitted from a broadcast station and regenerating a signal wave in the audio frequency band.

The analog receiver converts a broadcast wave to an IF signal of the intermediate frequency and removes unwanted frequency components by passing the IF signal through a band-pass filter 1 the intermediate frequency band as shown in FIG. 14, and obtains a signal wave (detection output) via a detection circuit 2.

[Problems to be Solved]

The inventor of the application has formed the aforementioned analog receiver via digital circuits to make an attempt to develop a digital receiver that is compatible with for example digital audio apparatus.

As one of such attempts, the inventor of the application has proposed that the band-pass filter shown in FIG. 14 includes a direct-type secondary IIR (infinite Impulse response) filter 1' shown in FIG. 15 and that a detection circuit subordinate to the digital band-pass filter 1' be digitized. That is, the inventor has proposed that the digital band-pass filter 1' includes digital adders 4, 5, 6, 7, digital delay elements 8, 9, and digital multipliers 10, 11, 12, 13, 14, and that digital data generated by converting an IF signal from a frequency converter undergo digital filtering.

While an IF signal is down-converted by a frequency converter, it is a signal prior to detection. Thus, using an IIR filter of a general configuration in FIG. 15 requires use of a large-scale digital circuit that allows high-speed arithmetic operation, making application to a receiver difficult.

SUMMARY OF THE INVENTION

The invention has been proposed to solve such problems involved in the related art and aims at providing a new receiver of a simple configuration that can allows high-accuracy digital signal processing.

[Means for Solving the Problems]

In order to attain the aforementioned object, the invention is a receiver comprising digital signal processing section for transmitting data corresponding to a desired frequency component from digital data in the intermediate frequency band to output the data to detection section, characterized in that the digital signal processing section comprises a digital band-pass filter for performing digital filtering on the digital data at a first sampling rate equal to an exponentiation multiple of 2 of the intermediate frequency and an interpolation filter including a digital low pass filter for performing digital filtering on the data output from the digital band-pass filter at a second sampling rate equal to an exponentiation multiple of 2 of the intermediate frequency, the second sampling rate higher than the first sampling rate, and that the output data of the interpolation filter is output to the detection section.

The receiver is characterized in that the first sampling rate is set to four times the intermediate frequency and that the digital band-pass filter includes an IIR filter whose multiplicand attribute is set to the value of an exponentiation multiple of 2.

The receiver is characterized in that the second sampling rate is set to 16 times the intermediate frequency and that the interpolation filter includes an IIR filter whose multiplicand attribute is set to the value of an exponentiation multiple of 2.

According to a receiver of such a configuration, the digital band-pass filter performs digital filtering on data in the intermediate frequency band at a first sampling rate equal to an exponentiation multiple of 2 of the intermediate frequency (a sampling rate lower than a second sampling rate) and the interpolation filter performs digital filtering on data output from the digital band-pass filter at a second sampling rate equal to an exponentiation multiple of 2 of the intermediate frequency, the second sampling rate higher than the first sampling rate, to output the data from the interpolation filter to the detection section.

In this way, via a configuration where digital data in the intermediate frequency band is processed at a lower sampling rate by a digital band-pass filter then processed at a higher sampling rate by an interpolation filter and output to detection section, the circuit scale of the digital band-pass filter and the interpolation filter can be simplified. That is, operating a digital band-pass filter at a low sampling rate makes it possible to simplify the circuit scale of the digital band-pass filter. Even in a configuration where an interpolation filter operating at a higher sampling rate is used together with the simplified digital band-pass filter, it is possible to further simplify the overall circuit scale than in a case where a digital band-pass filter of a general configuration is operated at a high sampling rate.

Moreover, data processed at a lower sampling rate by a digital band-pass filter is then processed at a higher sampling rate by an interpolation filter in order to upgrade the detection accuracy in detection section.

In order for detection section to perform high-accuracy detection, it is desirable to detect waves based on data processed at a high sampling rate. A receiver according to the invention provides both the simple circuit scale and the high-accuracy detection by a combination of a digital band-pass filter operating at a lower sampling rate and an interpolation filter operating at a higher sampling rate.

By setting the first sampling rate of the digital band-pass filter to an exponentiation multiple of 2 of (in particular four times) the intermediate frequency and the second sampling rate of the interpolation filter to an exponentiation multiple of 2 of (in particular 16 times) the intermediate frequency, it is possible to approximate, by using an exponentiation multiple of 2, the multiplicand attribute of an IIR filter that includes the digital band-pass filter and the interpolation filter respectively. This simplifies the circuit scale of a digital multiplier.

DETAILED DESCRIPTION OF THE PREFERRED EMBODIMENTS

[Mode for Carrying Out the Invention]

Figure 1:
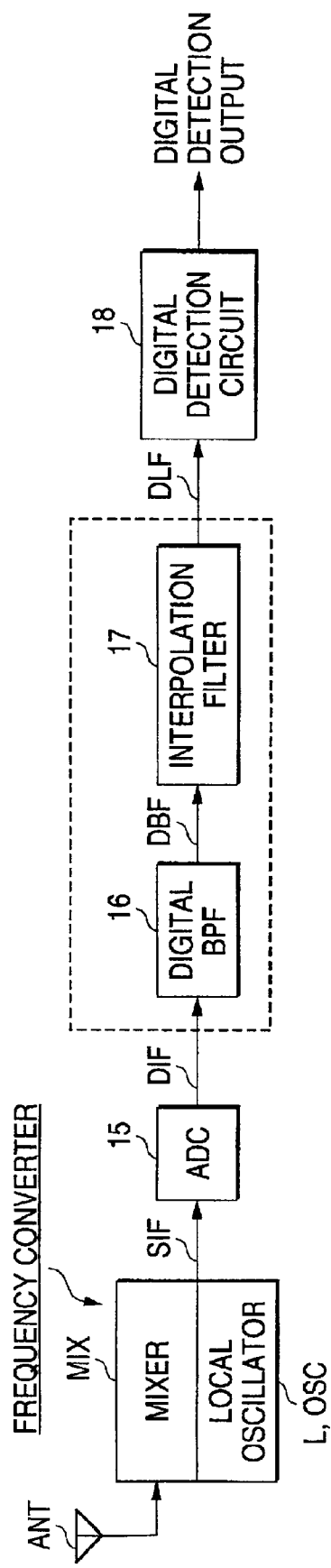
FIG. 1 is a block diagram showing a configuration of a receiver according to the invention.

An embodiment of the invention will be described referring to drawings. FIG. 1 is a block diagram showing the key configuration of an exemplary receiver for receiving an AM broadcast wave according to this embodiment.

In FIG. 1, the receiver down-converts an AM broadcast wave received at an antenna ANT to an IF signal $S_{IF}$ of the intermediate frequency (455 kHz) via a frequency converter including a mixer MIX and a local oscillator L.OSC, converts the analog IF signal $S_{IF}$ to digital data $D_{IF}$ via an A/D converter 15, then passes the digital data $D_{IF}$ through a digital signal processing circuit consisting of a digital band-pass filter 16 and an interpolation filter 17 supply the resulting data to a digital detection circuit 18.

As detailed later, the sampling frequency $f_{s0}$ of the A/D converter 15 is set to above four times the intermediate frequency $f_0$, the sampling rate $f_{s1}$ of the digital band-pass filter 16 is set to four times the intermediate frequency $f_0$, and the sampling rate $f_{s2}$ of the interpolation filter 17 is set to 16 times the intermediate frequency $f_0$, thus satisfying Nyquist sampling theorem.

The A/D converter 15 converts the analog IF signal $S_{IF}$ to 16-bit digital data $D_{IF}$. The digital band-pass filter 16 and the interpolation filter 17 perform 16-bit digital signal processing on the digital data $D_{IF}$.

Figure 2:
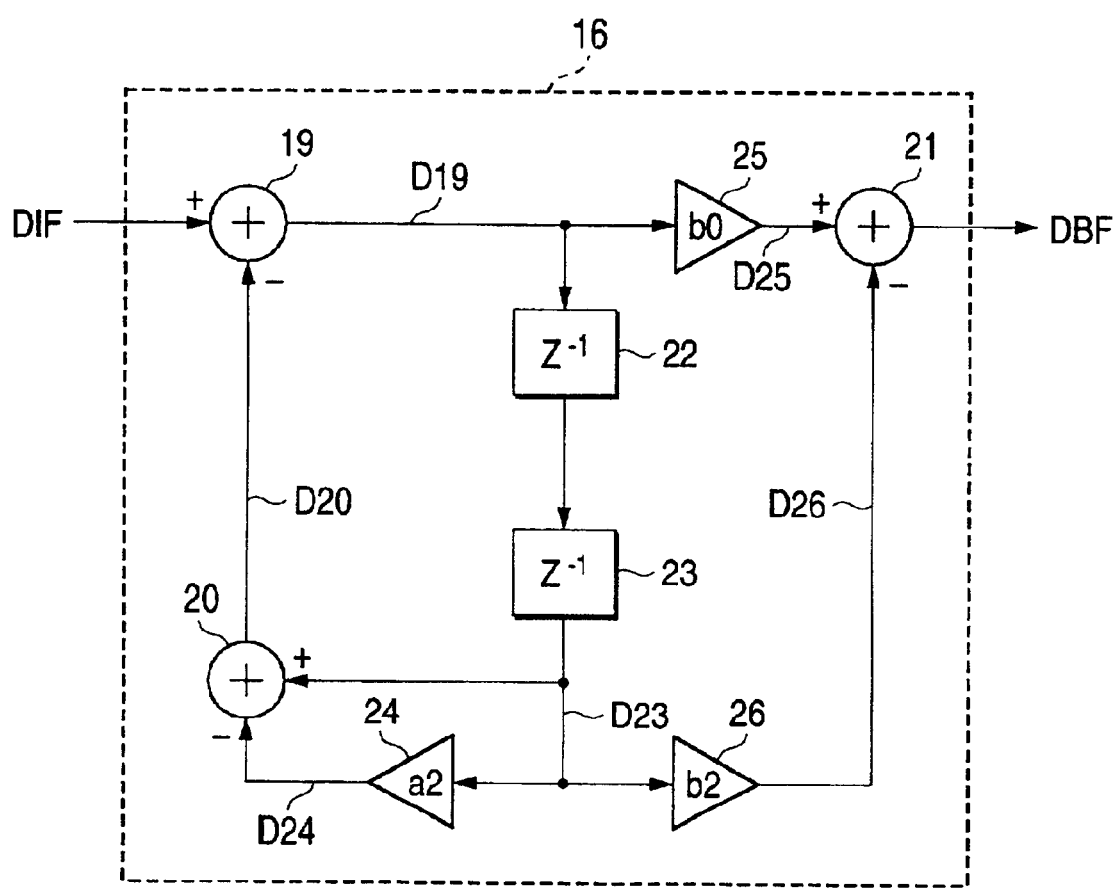
FIG. 2 shows a configuration of a digital band-pass filter provided in a receiver according to the invention.
Figure 3:
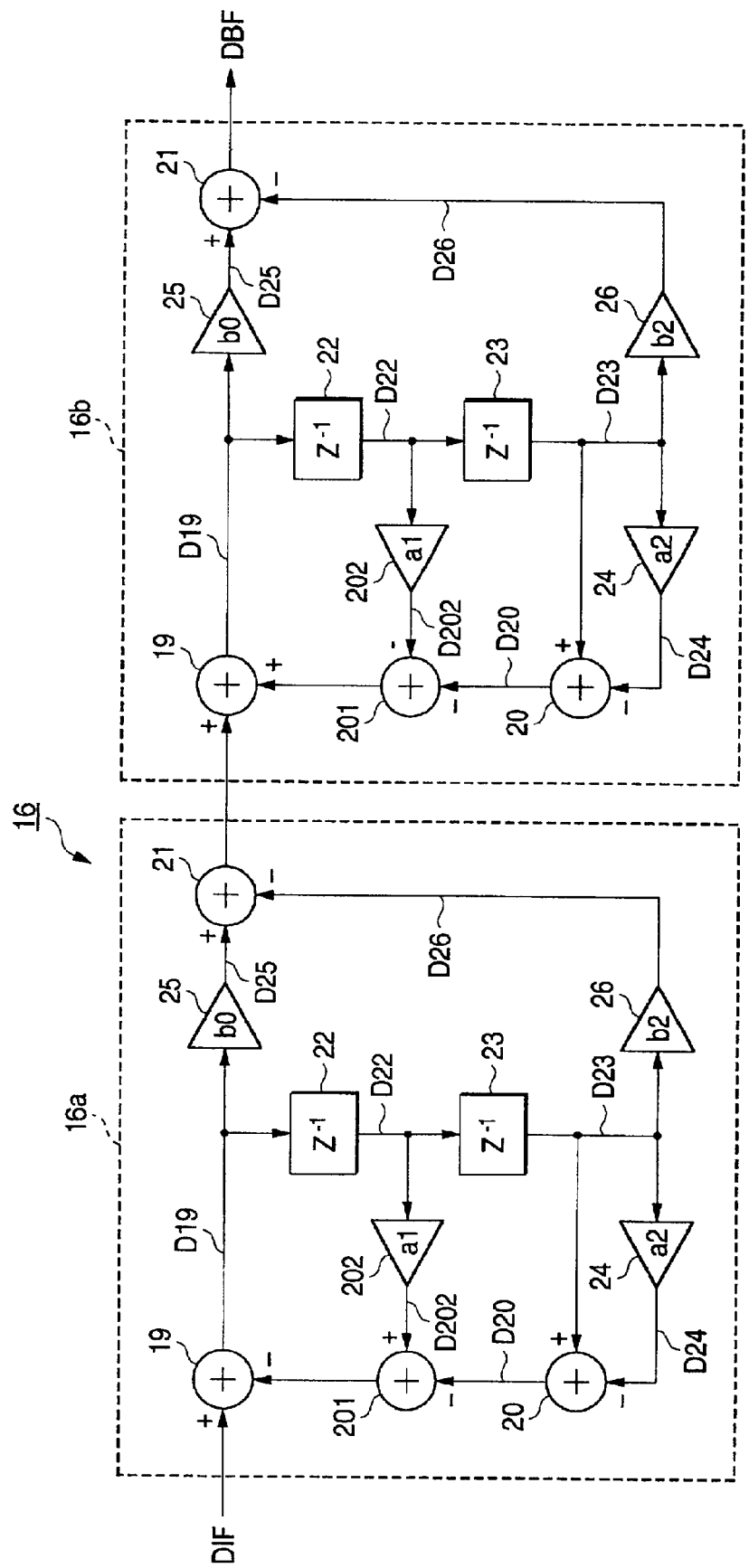
FIG. 3 shows a configuration of another digital band-pass filter provided in a receiver according to the invention.

The digital band-pass filter 16 is a direct-type second IIR filter and implemented as a direct-type secondary III filter shown in FIG. 2 or as a direct-type secondary III filter shown in FIG. 3, depending on the design specifications.

Figure 10:
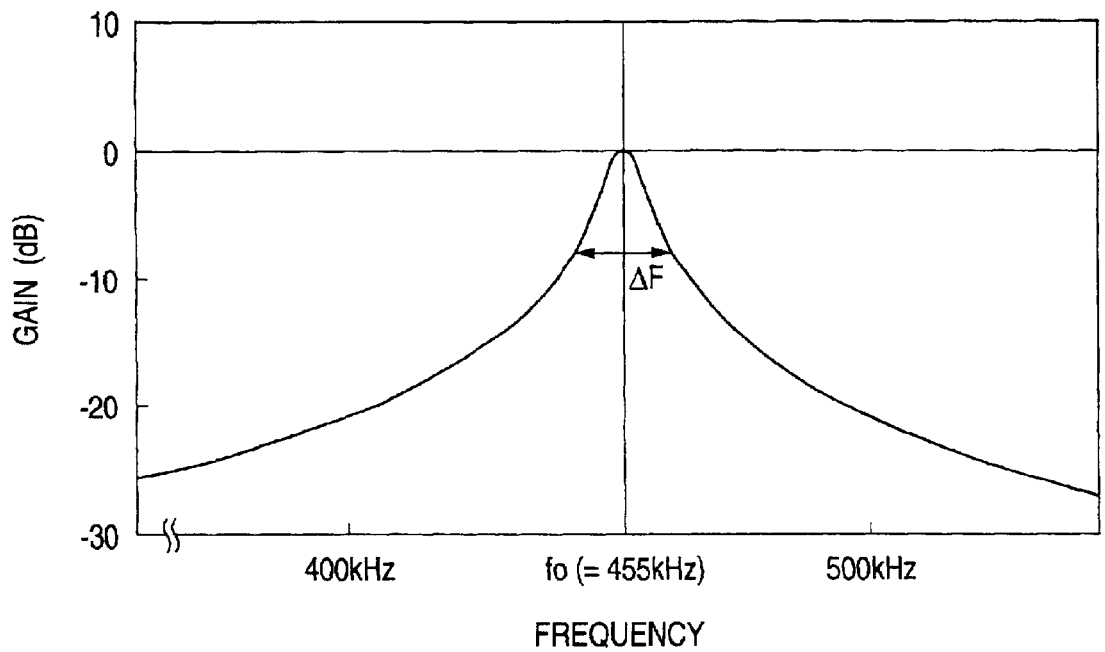
FIG. 10 shows frequency characteristics of a digital band pass filter shown in FIG. 2.

The digital band-pass filter 16 shown in FIG. 2 including a plurality of digital adders 19, 20, 21, digital delay elements 22, 23, and digital multipliers 24, 25, 26. The digital band-pass filter 16 is an IIR filter having single-peak characteristics where the maximum gain is obtained at the center frequency $f_0$(455 kHz) as shown in FIG. 10.

The bandwidth of the single-peak characteristics (6-dB bandwidth) ΔF around the center frequency $f_0$(455 kHz) is set to a width to allow an upper sideband wave and a lower sideband wave of the IF signal $S_{IF}$ to pass through the bandwidth and the Q value ($f_0$/ΔF) is set to characteristics that meet a particular need.

The digital band-pass filter 16 shown in FIG. 3 including two serially connected IIR filters 16a, 16b, each of which including a plurality of digital adders 19, 20, 201, digital delay elements 22, 23, and digital multipliers 24, 25, 26, 202.

The IIR filters 16a and 16b differ from each other in that the digital adder provided in the IIR filter 16a performs subtraction D202−D20 on the data D202, D20 provided by the digital multipliers 202, 20. The digital adder provided in the IIR filter 16b performs subtraction −D20−D202 on the data D202, D20 provided by the digital multipliers 202, 20.

In this way, the digital band-pass filter 16 shown in FIG. 3 comprising two serially connected IIR filters 16a, 16b have twin-peak characteristics around the center frequency $f_0$(455 kHz). The bandwidth of the twin-peak characteristics (6-dB bandwidth) ΔF around the center frequency $f_0$ (455 kHz) is set to a width to allow an upper sideband wave and a lower sideband wave of the IF signal $S_{IF}$ to pass through the bandwidth and the Q value ($f_0$/ΔF) is set to characteristics that meet a particular need.

Figure 6:
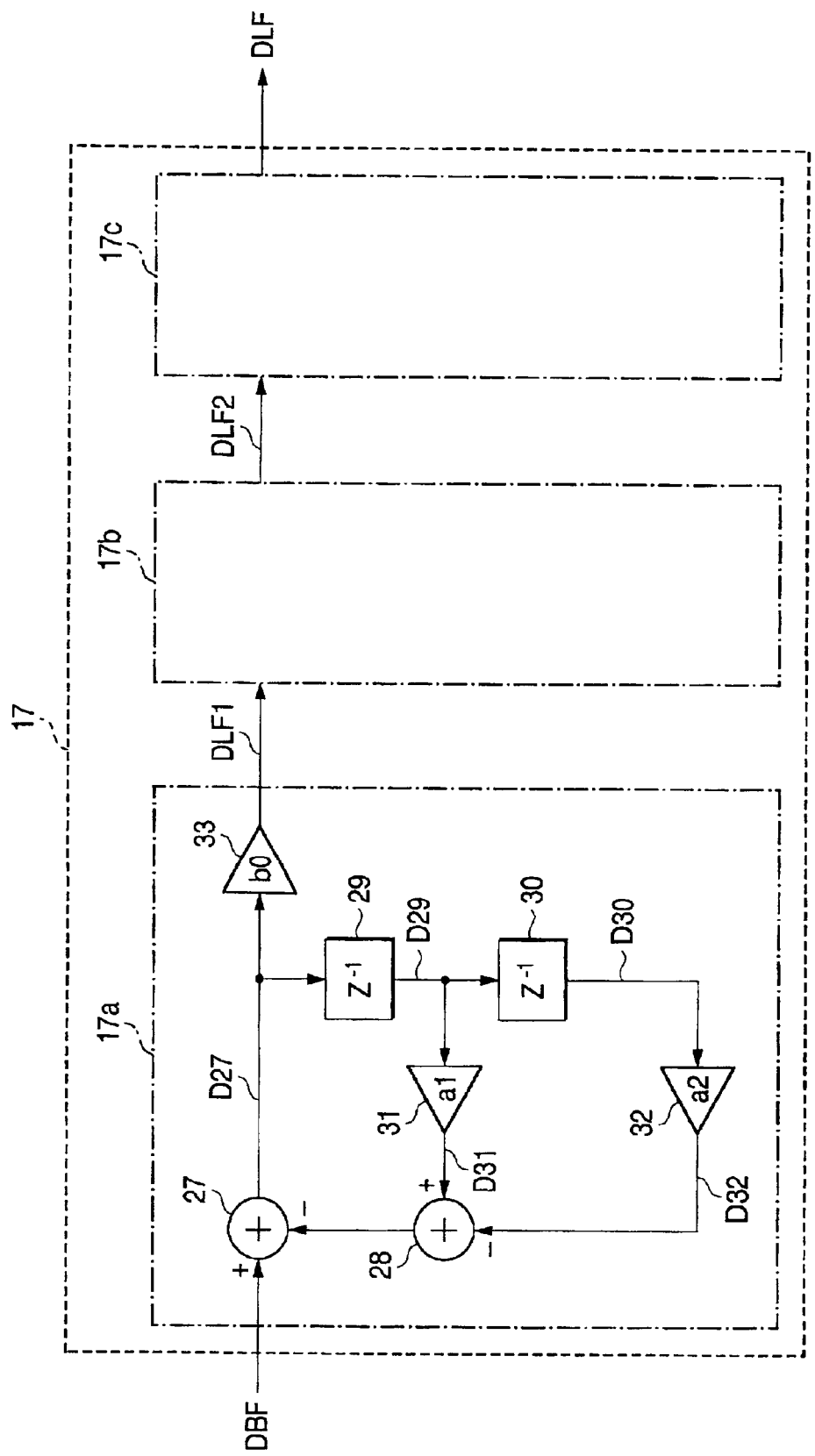
FIG. 6 shows a configuration of an interpolation filter provided in a receiver according to the invention.

The interpolation filter includes three IIR filters of the same configuration 17a, 17b, 17c as shown in FIG. 6.

The IIR filter 17a includes a plurality of digital adders 27, 28, digital delay elements 29, 30, and digital multipliers 31, 32, 33. The remaining IIR filters have the same configuration as the IIR filter 17a.

Figure 11:
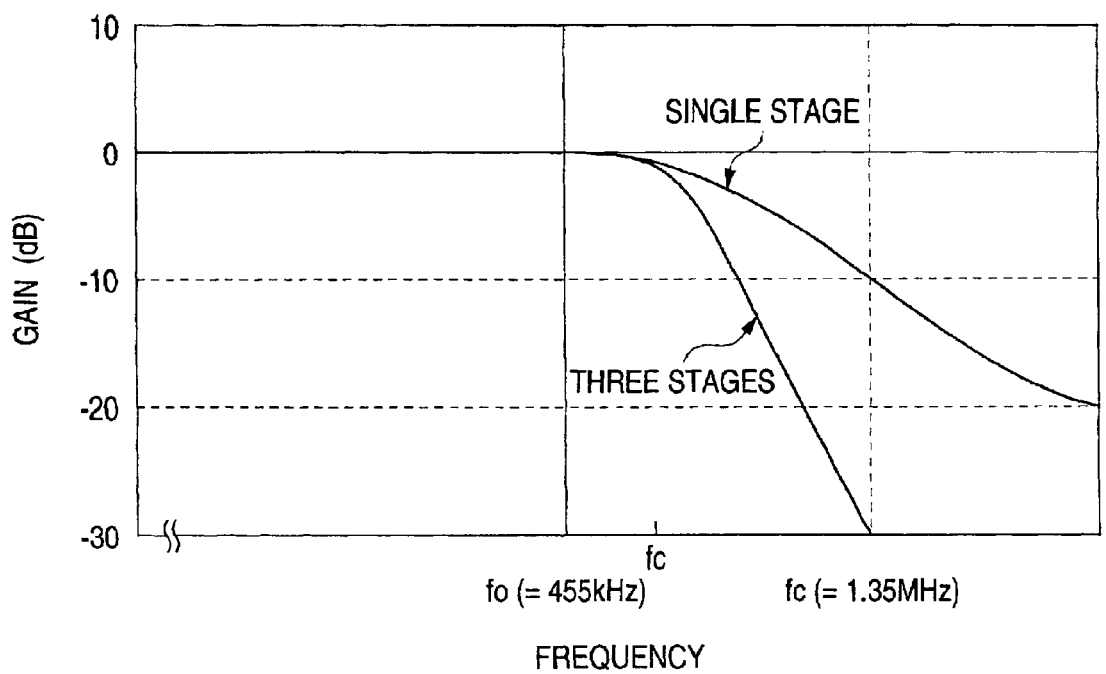
FIG. 11 shows frequency characteristics of an interpolation filter shown in FIG. 6.

As shown in FIG. 11, frequency characteristics is implemented where the gain in the high frequencies above the cutoff frequency $F_c$ is suddenly attenuated by synthesizing the frequency characteristics of three stages of IIR filters 17a, 17b, 17c.

The cutoff frequency of each of the IIR filters 17a, 17b, 17c is set to a frequency higher than the center frequency $f_0$ (455 kHz). In particular, the cutoff frequency is set to obtain a passband to pass an upper sideband wave of the IF signal $S_{IF}$.

Next, configuration of the digital band-pass filter 16 shown in FIGS. 2 and 3 and the interpolation filter 17 will be described to detail the configuration, operation and features of these filters 16, 17.

A transfer function H(z) z-converted as shown in the next expression (1) is applied to the band-pass filter 16 shown in FIG. 2.

[Expression 1]

$$H(z)=(b0+b1\cdot z^{-1}+b2\cdot z^{-2})/(1-a1\cdot z^{-1}+a2\cdot z^{-2}) \quad (1)$$

Figure 15:
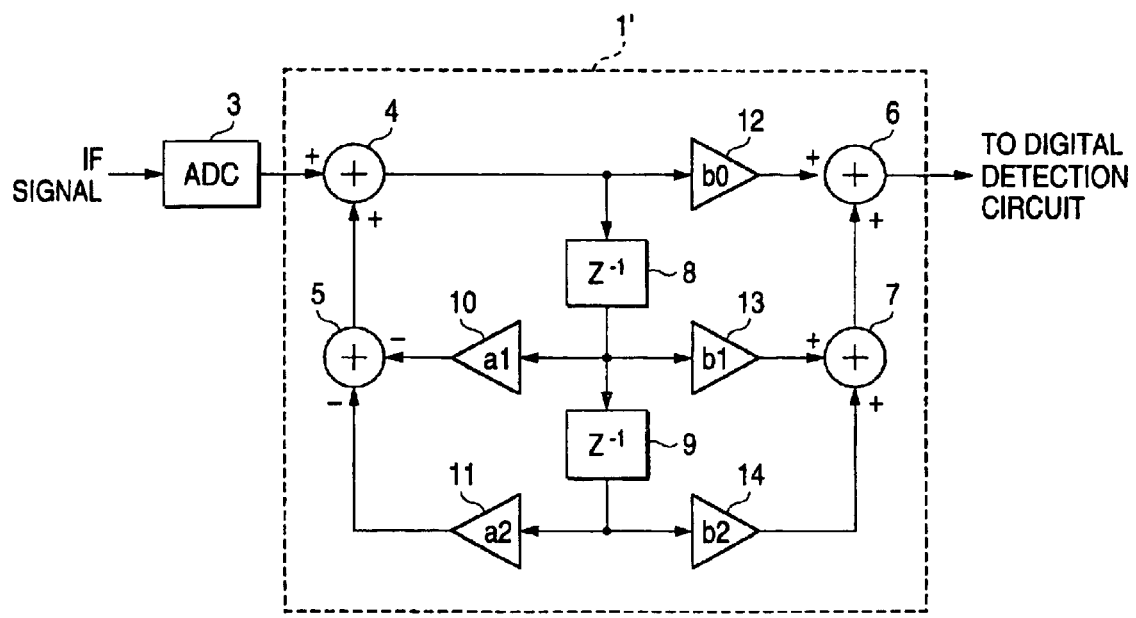
FIG. 15 shows a configuration of a general IIR filter.

First, a direct-type secondary IIR filter shown in FIG. 15 is assumed based on this transfer function H(z) and the optimum value of each of the multiplicand attributes a1, a2, b0, b1 and b2 of the transfer function H(z).

Next, each of the multiplicand attributes a1, a2, b0, b1 and b2 is optimized under the optimization conditions that the digital band-pass filter is implemented via a simple configuration, considering the relationship between the sampling rate $f_{s1}$ and the intermediate frequency $f_0$ (455 kHz) and Q value.

As an example, assuming the Q value as 50 and the sampling rate $f_{s1}$ as four times the intermediate frequency $f_0$, each of the multiplicand attributes a1, a2, b0, b1 and b2 is as shown in the next expression (2), especially, both multiplicand attributes a1 and b1 being set to 0.

[Expression 2]

$$a1=0$$
$$a2=0.96721311$$
$$bo=0.016393443 \} \quad (2)$$
$$b1=0$$
$$b2=-0.01639443$$

In case multiplicand attributes a1, b1 are set to 0, digital multipliers 10, 13 in FIG. 15 do not contribute to arithmetic operation on data D23, D26, so that these digital multipliers 10, 13 are omitted. Further, digital adders 5, 7 in FIG. 15 are also omitted because they are no longer required. It is thus possible to implement a digital band-pass filter 16 of a simple configuration shown in FIG. 2.

In this way, it is possible to set both multiplicand attributes a1 and b1 to 0 by fixing the sampling rate $f_{s1}$ to four times the intermediate frequency $f_0$. As a result, it is possible to implement a digital band-pass filter 16 (see FIG. 2) of a simple configuration where four components, that is, digital multipliers 10, 13 and digital adders 5, 7 are no longer required.

The digital band-pass filter 16 shown in FIG. 2 has a configuration where digital multipliers 10, 13 and digital adders 5, 7 in FIG. 15 are omitted as well as a combination of a digital multiplier 24 and a new digital adder 20 is used to generate data D20 to be supplied to the digital adder 19, thus further reducing the circuit scale.

In a configuration where the digital adder 20 is not equipped but the multiplicand attribute a2=0.96721311 shown in Expression (2) is applied and output data D24 (=0.96721311×D23) of the digital multiplier 24 is supplied as the data D20 to the digital adder 19, the circuit scale can be made smaller than via the IIR filter 1' shown in FIG. 15. Note that, since the multiplicand attribute a2 is a fraction having a large number of digits, having the digital multiplier 24 alone perform the arithmetic operation (0.96721311× D23) requires a complicated digital multiplier with a large circuit scale.

As shown in FIG. 2, a combination of the digital multiplier 24 and the digital adder 20 is used to substantially perform the arithmetic operation (0.96721311×D23) to allow reduction of the circuit scale.

Details of reduction of the circuit scale will be given. The multiplicand attribute a2 of the digital multiplier 24 does not apply the value a2=0.96721311 shown in Expression (2) but determined by the following configuration method.

The multiplicand attribute a2 of Expression (2) is deformed to express a2=1−0.03278689, and the value of an exponentiation multiple of 2 ($2^n$) closest to the value of 0.03278689 is selected to determine the actual multiplicand attribute a2 of the digital multiplier 24 of $2^{-5}$ (=0.03125)

Further, subtraction of the value of '0.03278689' from the value '1' concerning the variation example of a2=1− 0.03278689 is made via the digital adder 20.

In such a configuration, data D24 generated by the digital adder 24 with the multiplicand attribute a2 set to $2^{-5}$ is ($2^{-5}$×D23), and data D20 generated by the digital adder 20 is (D23−$2^{-5}$×D23). Thus the output data D20 is expressed by Expression (3). This obtains results substantially equivalent to a case where the multiplicand attribute a2 of the digital multiplier 24 is set to the value of a2=0.96721311 shown in Expression (2) to obtain data D20 (=0.96721311×d23), without providing the digital adder 20.

[Expression 3]

$$D3 = D23 - D24 = D23 - D23 \times a2$$

$$= D23 \times (1-a2) = D23 \times (1-2^{-5})$$

$$= D23 \times (1-0.03125)$$

$$= D23 \times 0.96875 \quad (3)$$

Since the digital multiplier 24 performs arithmetic operation of the multiplicand attribute a2 (=$2^{-5}$) as an exponentiation multiple of 2, a digital multiplier 24 may be a simple digital multiplier. Further, since a digital adder 20 performs simple subtraction, the digital adder 20 may be a simple digital adder. As a result, adding a digital adder 20 to a digital multiplier 24 reduces the circuit scale compared with providing a digital multiplier alone to perform complicated arithmetic operation.

Figure 4:
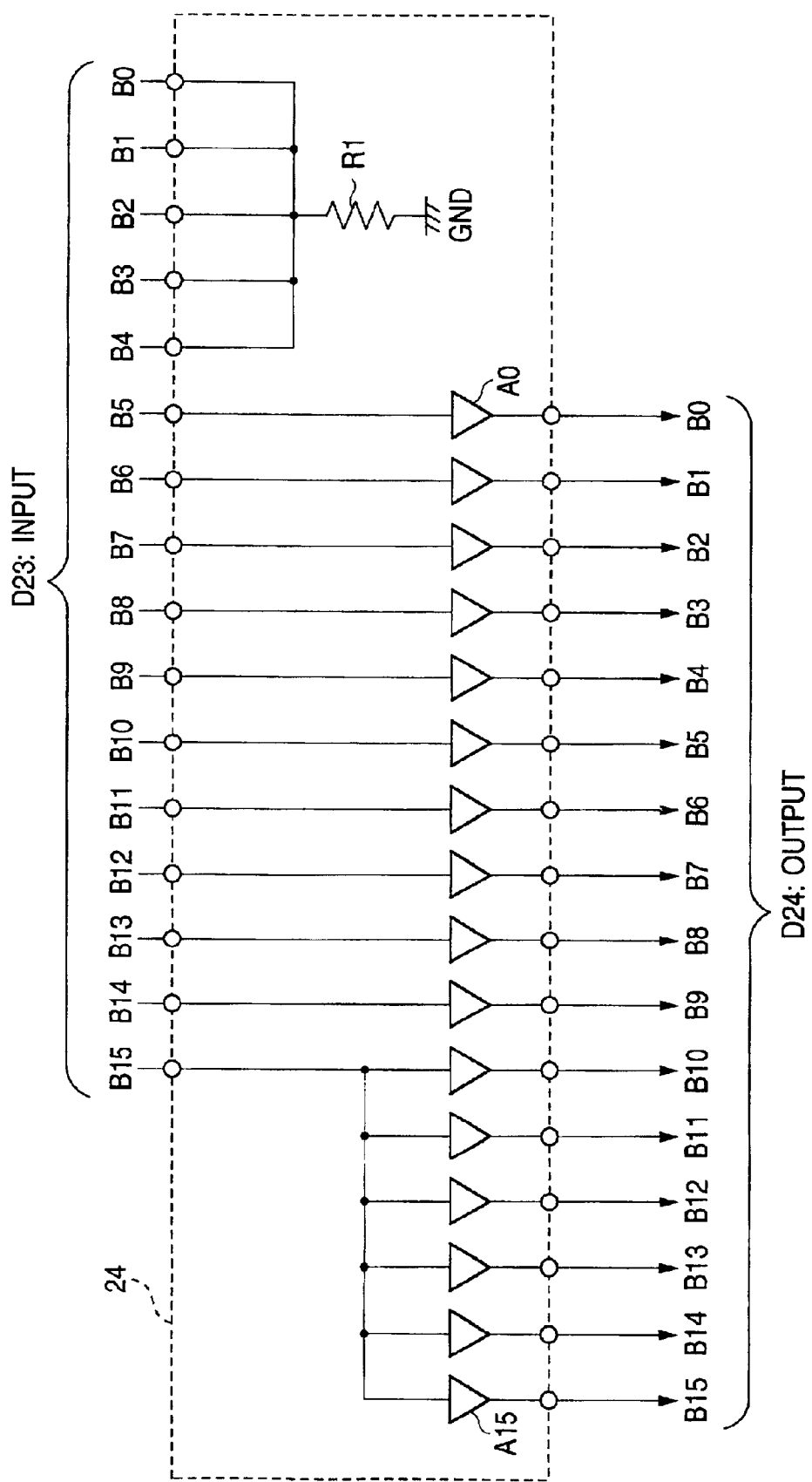
FIG. 4 shows a configuration of a digital multiplier 24 provided in a digital band-pass filter shown in FIGS. 2 and 3.

Further, as an example of the digital multiplier 24 shown in FIG. 2, a decoder circuit shown in FIG. 4 is applied to effectuate the reduction of the circuit scale.

The digital multiplier 24 shown in FIG. 4 outputs bits B5 to B15 of the input data D23 as bits B0 to B10 of the output data D24, as well as outputs bit B15 of the input data D23 as bits B10 to B15 of the output data D24. Bits B0 to B4 of the input data D23 are pulled down to the ground GND via a resistor R1 and the output data D24(B15 to B0) is output via buffer amplifiers A15 to A0.

According to such a configuration, just shifting the entire input data D23(B15 to B0) to the lower bits by five bits provides a feature equivalent to multiplying the data D23 by the multiplicand attribute a2 (=$2^{-5}$). Further, just supplying the data D24 obtained via this bit shift to the digital adder 20 provides the results equivalent to the arithmetic operation D20=0.96721311×D23 with the value a2=0.96721311 shown in Expression (2) applied, that is, the results of the arithmetic operation D20=(1−$2^{-5}$)×D23.

In this way, further reduction of the circuit scale is provided via a combination of the digital adder 20 and the digital multiplier 24.

Next, a digital multiplier 25 in FIG. 2 will be described. The multiplicand attribute b0 of the digital multiplier 25 is determined as follows. The multiplicand attribute b0 of the digital multiplier 25 is fixed to the value of $2^{-6}$ (=0.015625) by selecting the value of an exponentiation multiple of 2 ($2^n$) closest to the multiplicand attribute b0=0.016393443 shown in Expression (2).

Figure 5:
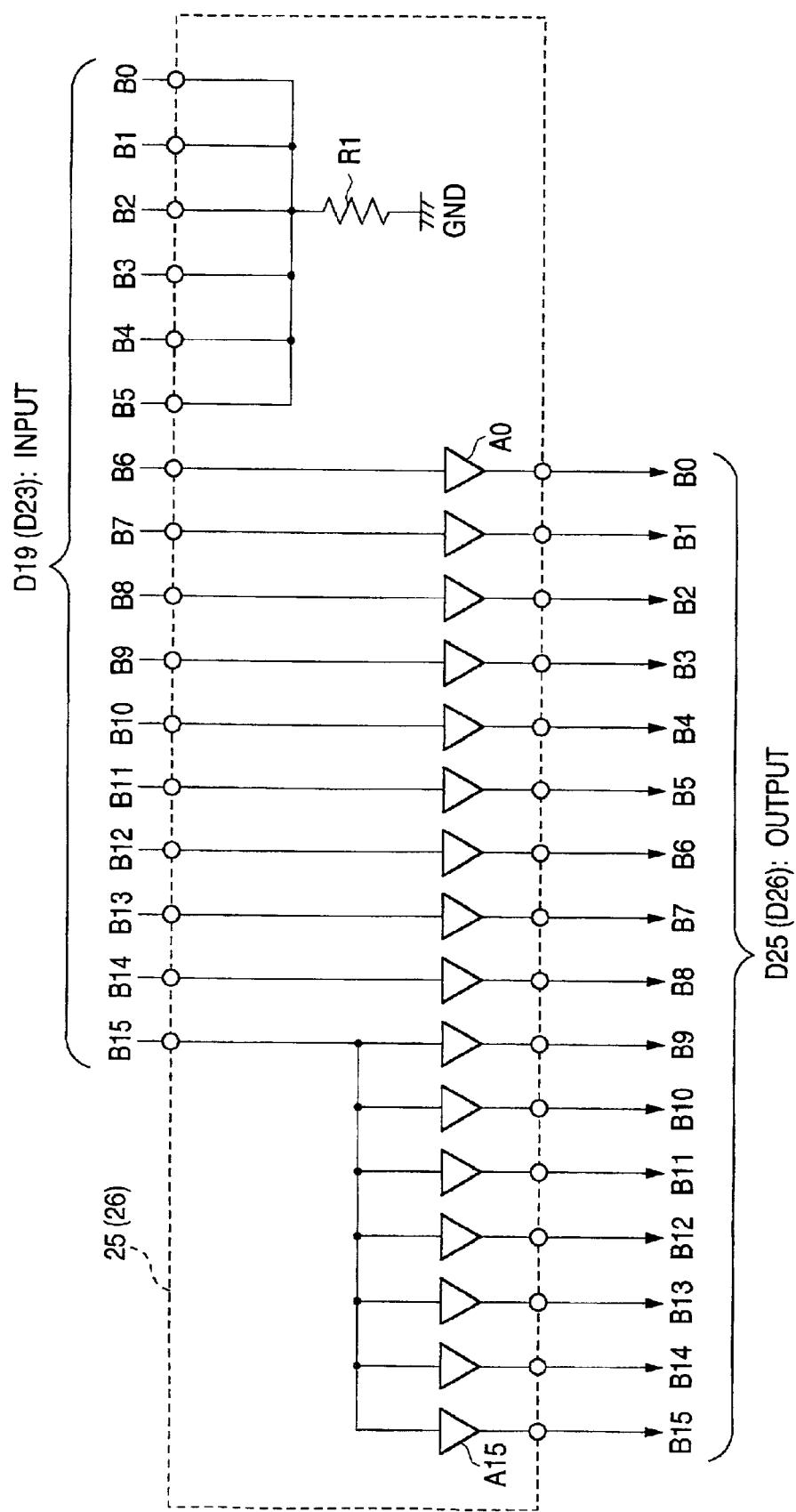
FIG. 5 shows configurations of digital multipliers 25, 26 provided in a digital band-pass filter shown in FIGS. 2 and 3.

Further, by applying a decoder circuit shown in FIG. 5 to the design of the digital multiplier 25 shown in FIG. 2, without forming the digital multiplier 25 with complicated arithmetic operation circuits, the digital multiplier of an extremely simple configuration that obtains the same results as obtained by multiplying data D19 by the multiplicand attribute b0=$2^{-6}$ is implemented.

The digital multiplier 25 shown in FIG. 5 outputs bits B6 to B15 of the input data D19 as bits B0 to B10 of the output data D25, as well as outputs bit B15 of the input data D19 as bits B9 to B15 of the output data D25. This configuration provides the same feature as that obtained by shifting the entire input data D19 (B15 to B0) to the lower bits by six bits and supplying the bit-shifted output data D25 (B15 to B0) to the digital adder 21, thus implementing the digital multiplier 25 that multiplies the data D19 by the multiplicand attribute b0 (=$2^{-6}$).

Bits B0 to B5 of the input data D19 are pulled down to the ground GND via a resistor R1 and the output data D25(B15 to B0) is output via buffer amplifiers A15 to A0.

Next, the multiplicand attribute b0 of the digital multiplier 26 in FIG. 2 is determined as follows. The multiplicand attribute b0 of the digital multiplier 26 is fixed to the value of $2^{-6}$ (=0.015625) by selecting the value of an exponentiation multiple of 2 ($2^n$) closest to the multiplicand attribute b0=−0.016393443 shown in Expression (2).

Further, by applying a decoder circuit shown in FIG. 5 to the design of the digital multiplier 26 shown in FIG. 2, without forming the digital multiplier 26 with complicated arithmetic operation circuits, the digital multiplier of an extremely simple configuration that obtains the same results as obtained by multiplying data D23 by the multiplicand attribute b0=$2^{-6}$ is implemented.

By applying a decoder circuit shown in FIG. 5, it is possible to provide the same feature as that obtained by shifting the entire input data D23 (B15 to B0) to the lower bits by six bits and supplying the bit-shifted output data D26 (B15 to B0) to the digital adder 21.

Subtraction D25–D26 is performed by supplying the output data D25 of the digital multiplier 25 to the addition input terminal (plus input terminal) of the digital adder 21 and by supplying the output data D26 of the digital multiplier 26 to the subtraction input terminal (minus input terminal) of the digital adder 21. Then, the operation results $D_{BF}$ (=D25–D26) is assumed as the output of the digital band-pass filter 16.

In this way, by providing the digital band-pass filter 16 in FIG. 1 in configurations shown in FIGS. 2, 4 and 5, providing a sampling rate $f_{s1}$ four times the center frequency $f_0$ (455 kHz), and performing digital filtering on the intermediate frequency data $D_{IF}$ supplied from the A/D converter 15, an IIR filter having frequency characteristics shown in FIG. 10 is implemented via a simple configuration.

The configuration method of band-pass filters shown in FIG. 3 will be described. A pre-stage filter 16a and a post-stage filter 16b are both provided in variation of the digital band-pass filter 16 shown in FIG. 2.

The transfer function H(z) shown in Expression (1) is applied. A direct-type secondary IIR filter shown in FIG. 15 is considered based on the transfer function H(z). Then, the optimum value of each of the multiplicand attributes a1, a2, b0, b1, b2 is obtained in order to acquire the frequency characteristics show in FIG. 12. Under the optimization conditions that the digital band-pass filter 16 is implemented via a simple configuration, optimization of each of the multiplicand attributes a1, a2, b0, b1, b2 is carried out while considering the relationship between the sampling rate $f_{s1}$ for digital filtering, the intermediate frequency $f_0$, and the Q value.

Via such optimization, the pre-stage filter 16a and the post-stage filter 16b are both provided in configuration in FIGS. 2, 4 and 5. That is, by implementing the filter 16a and the filter 16b via a simple configuration shown in FIGS. 2, 4 and 5, the multiplicand attribute a2, b0, b2 of the digital multipliers 24, 25, 26 is set to a2=$2^{-5}$=0.03125, b0=$2^{-6}$=0.015625, b2=$2^{-6}$=0.015625, respectively.

Next, a digital adder 201 and a digital multiplier 202 are added to the filter 16a and the filter 16b shown in FIG. 3, respectively.

Connection is made so that the output data D202 of the digital multiplier 201 is supplied to the addition input terminal (plus terminal) of the digital adder 201 in the filter 16a, the output data D20 of the digital adder 20 is supplied to the subtraction input terminal (minus terminal) of the digital adder 201, the output data D202 of the digital multiplier 202 is supplied to the subtraction input terminal (minus terminal) of the digital adder 201 in the filter 16b, and the output data D20 of the digital adder 20 is supplied to the subtraction input terminal (minus terminal) of the digital adder 201

Figure 12:
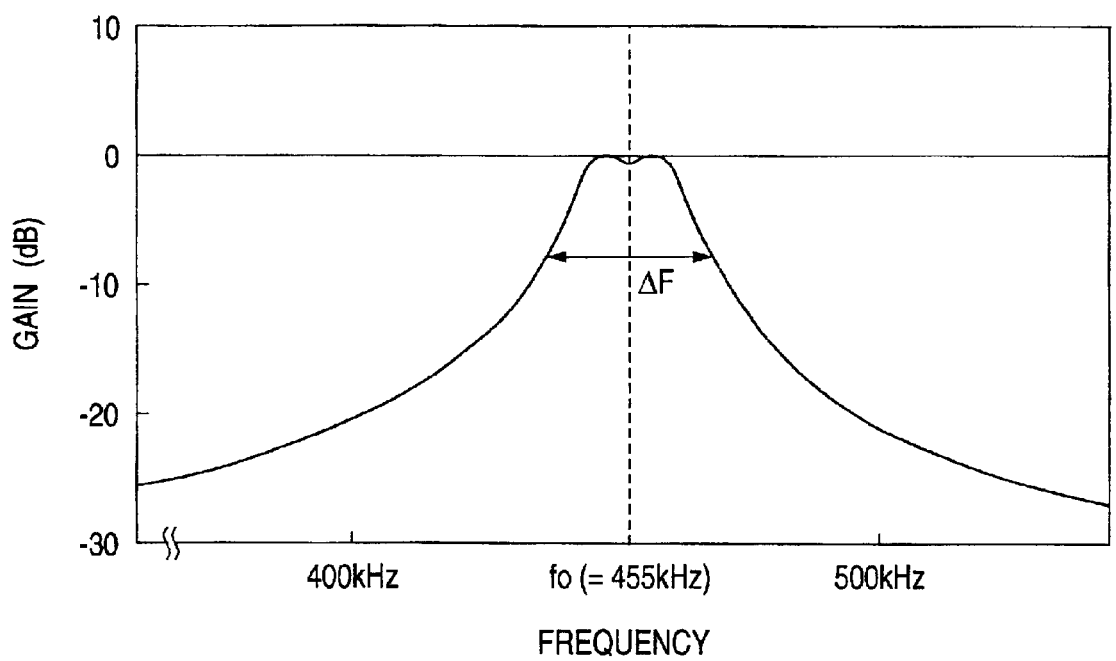
FIG. 12 shows frequency characteristics of a digital band pass filter shown in FIG. 3.

Further, by appropriately selecting the multiplicand attributes a1, a1 of the digital multiplier 202 in the filter 16a and the digital multiplier 202 in the filter 16b respectively, a digital band-pass filter having twin-peak characteristics shown in FIG. 12 is formed. By setting the respective multiplicand attributes a1, a1 to the value of an exponentiation multiple of 2 ($2^n$), the digital multiplier 202 in the filter 16a and the digital multiplier 202 in the filter 16 can be configured by a decoder circuit shown in FIG. 4 or 5 in order to implement a simple configuration.

In this way, by providing the digital band-pass filter 16 in FIG. 1 in a configuration shown in FIG. 3, providing a sampling rate $f_{s1}$ four times the center frequency $f_0$ (455 kHz), and performing digital filtering on the intermediate frequency data $D_{IF}$ supplied from the A/D converter 15, an IIR filter having frequency characteristics shown in FIG. 12 is implemented via a simple configuration. A combination of digital band-pass filters having different center frequencies can provide desired characteristics.

Next, the configuration method of interpolation filters shown in FIG. 6 will be described. A pre-stage filter 17a, a middle-stage filter 17b and a post-stage filter 17c in FIG. 6 have the same configuration. Thus, the configuration method of the pre-stage filter 17a will be described as a representative.

As mentioned earlier, the digital band-bass filter 16 performs digital filtering based on the sampling rate $f_{s1}$ four times the center frequency $f_0$ to output data $D_{BF}$. Thus, as shown in FIGS. 13A and 13B, the data $D_{BF}$ indicates data at four sampling points P1 to P4 in one cycle (1/$f_0$) as the reciprocal of the intermediate frequency $f_0$.

Figure 13A:
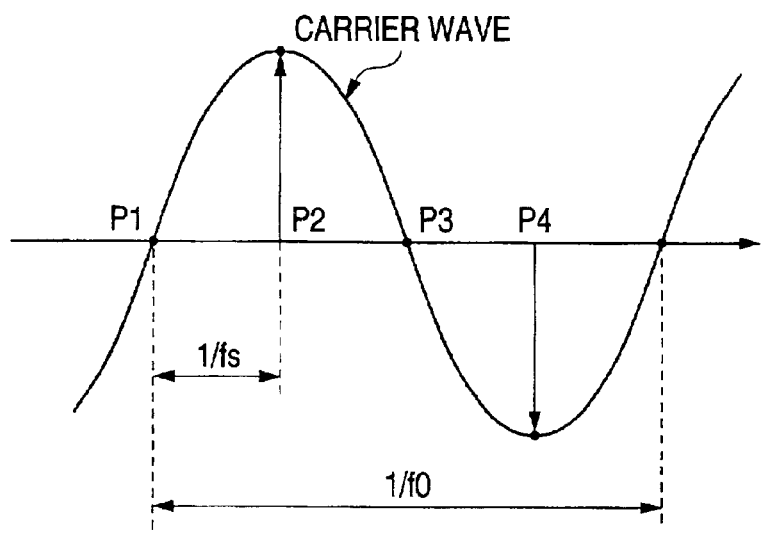
FIGS. 13A and 13B are explanatory drawings to explain the features of an interpolation filter.
Figure 13B:
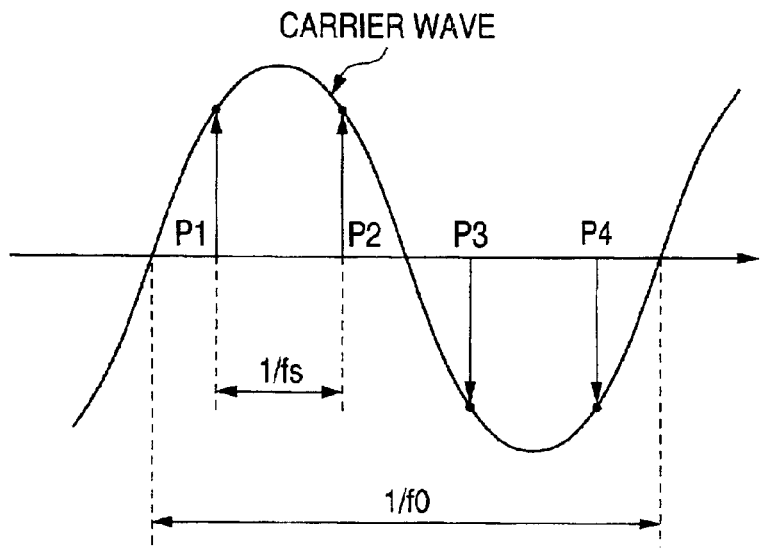
Figure 14:
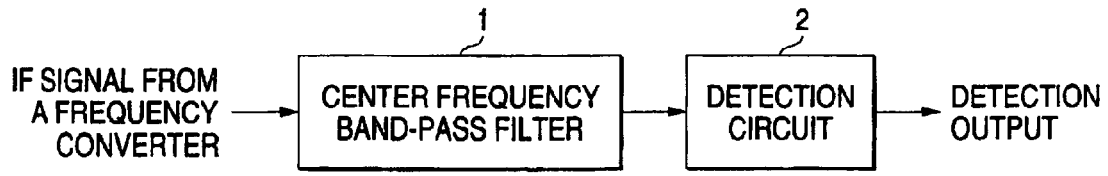
FIG. 14 is a block diagram showing an analog receiver according to the related art.

Data $D_{BF}$ appearing at four sampling points P1 to P4 in one cycle (1/$f_0$) does not assure high-accuracy detection since the detection output level varies considerably even when data $D_{BF}$ is supplied to a digital detection circuit 18 for detection when the phases of the sampling points P1 to P4 are dislocated, such as in the case of FIGS. 13A and 13B.

Thus, in order to allow high-accuracy detection, an interpolation filter 17 including a digital low pass filter is provided between the digital band-bass filter 16 and the digital detection circuit 18.

The transfer function H(z) shown in Expression (4) below is applied in forming the filter 17a. A digital low pass filter shown in FIG. 6 is considered based on the transfer function H(z). Then, the optimum value of each of the multiplicand attributes a1, a2, b0 is obtained.

[Expression 4]

$$H(z)=b0/(1+a1\cdot z^{-1}-a2\cdot z^{-2}) \qquad (4)$$

Under the optimization conditions that the filter 17 is implemented via a simple configuration, optimization of each of the multiplicand attributes a1, a2, b0 is carried out while fixing the sampling rate $f_{s2}$ to 16 times the center frequency $f_0$ (455 kHz)

Via such optimization, the multiplicand attributes a1, a2, b0 becomes $2^{-2}$, $2^{-1}$ and $2^{-2}$, respectively.

Thus, the multiplicand attribute a1 of the digital multiplier 31 in the filter 17a is fixed to $2^{-2}$, the multiplicand attribute a2 of the digital multiplier 32 to $2^{-2}$, and the multiplicand attribute b0 of the digital multiplier 33 to $2^{-2}$.

Figure 7:
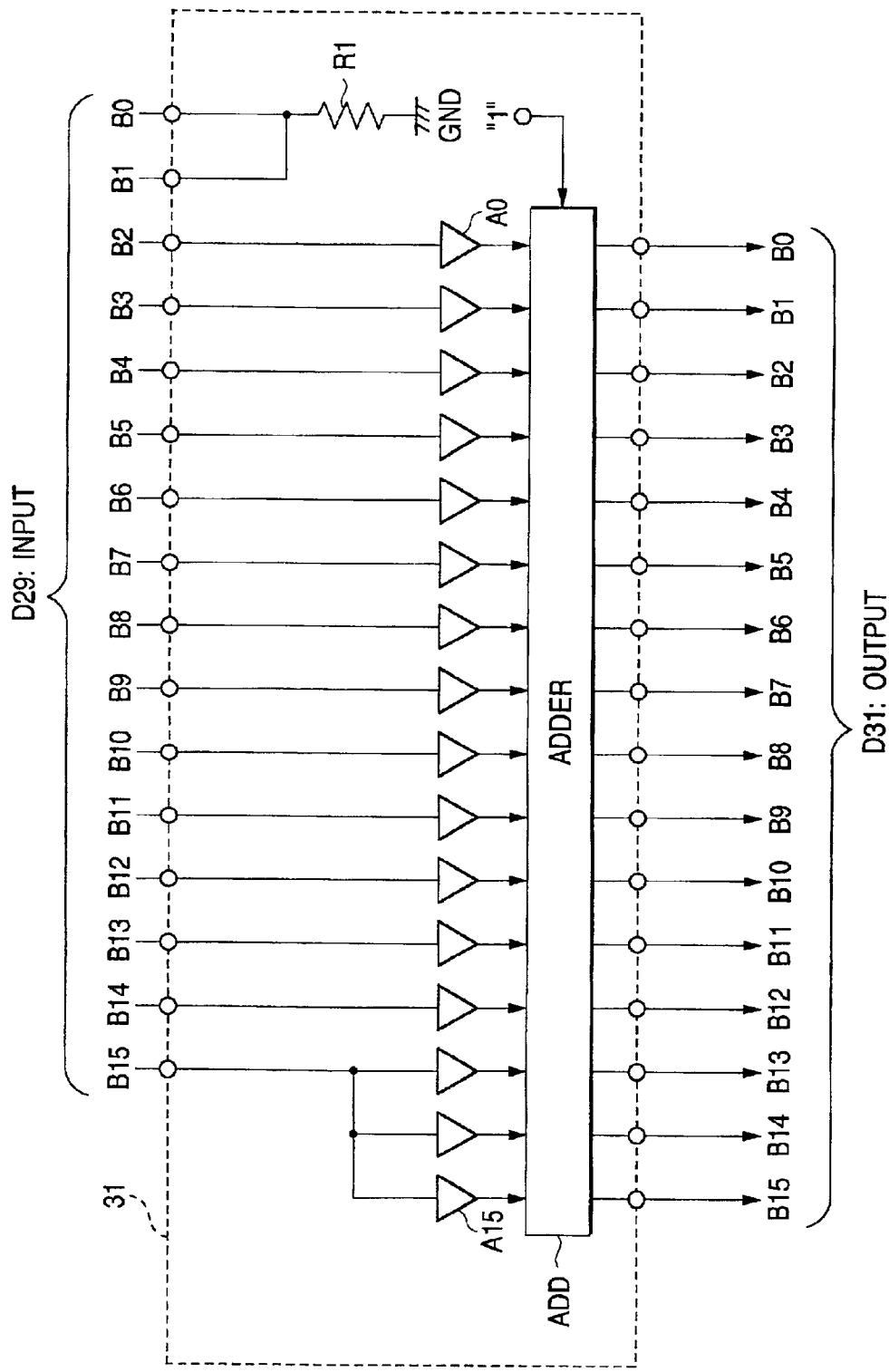
FIG. 7 shows a configuration of a digital multiplier 31 provided in an interpolation filter shown in FIG. 6.
Figure 8:
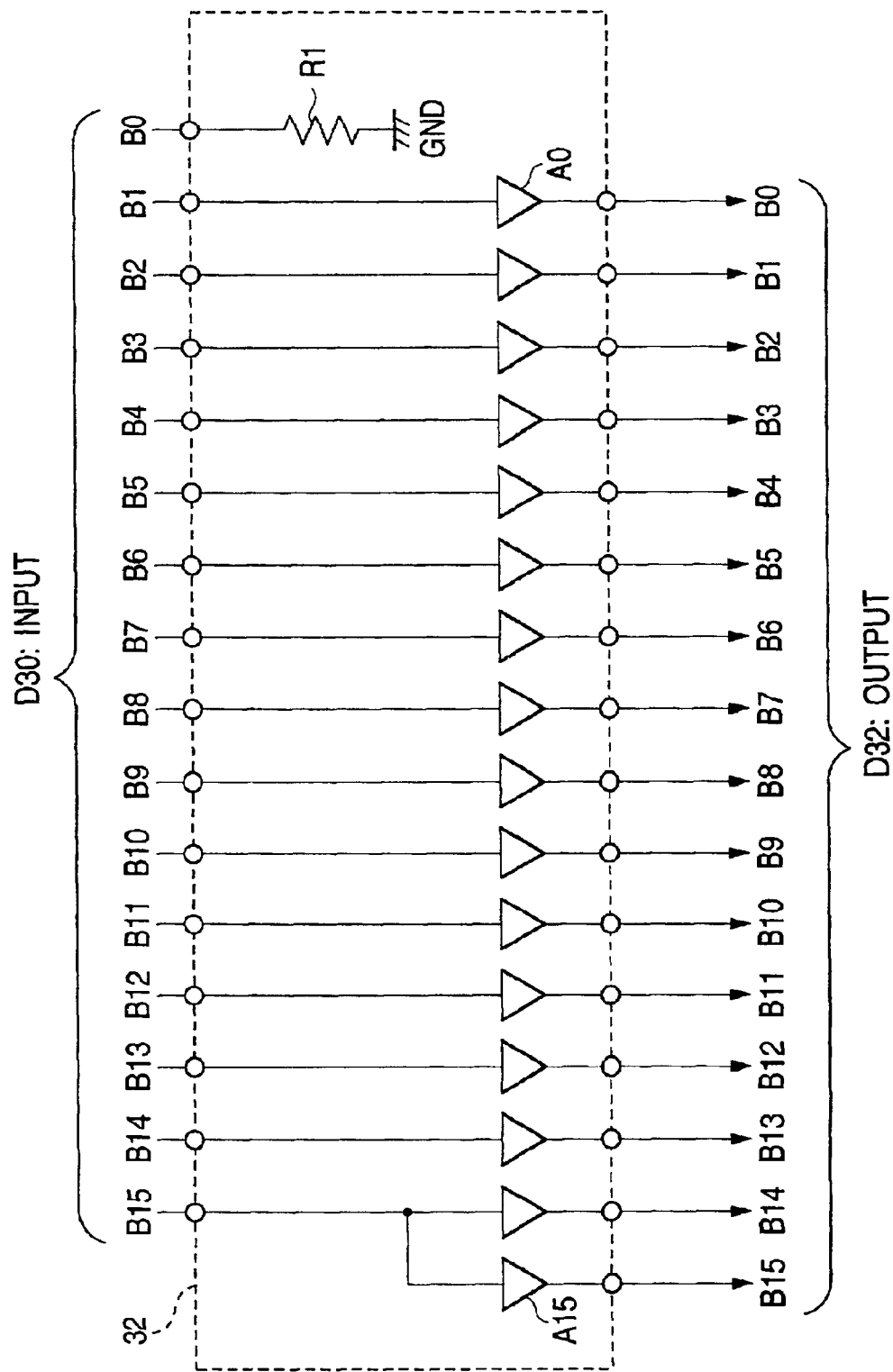
FIG. 8 shows a configuration of a digital multiplier 32 provided in an interpolation filter shown in FIG. 6.
Figure 9:
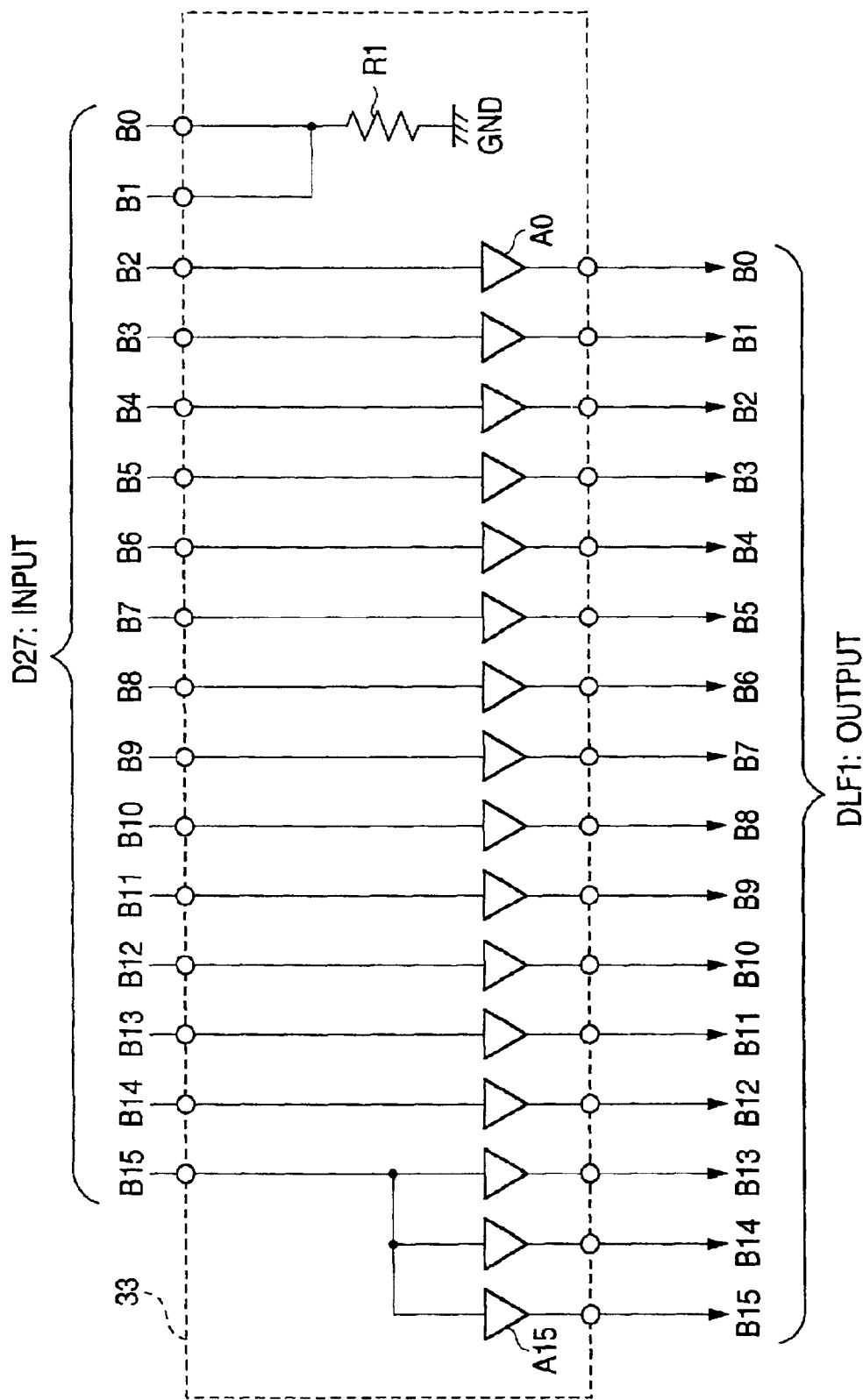
FIG. 9 shows a configuration of a digital multiplier 33 provided in an interpolation filter shown in FIG. 6.

Same as a decoder circuit shown in FIG. 4 or 5, the digital multiplier 31 is configured by a decoder circuit shown in FIG. 7, the digital multiplier 32 by a decoder circuit shown in FIG. 8, and the digital multiplier 33 by a decoder circuit shown in FIG. 9 respectively in order to implement each digital multiplier 31, 32, 33 via a simple configuration. By configuring filters 17b, 17c same as a filter 17a, an interpolation filter 17 having frequency characteristics shown in FIG. 11 is implemented.

In this way, in a receiver according to the embodiment, it is possible to approximate the multiplicand attributes a1, a2, b0, b2 of the digital multipliers 24, 25, 26, 202 shown in FIGS. 2 and 3 by using exponentiation multiples of 2 by setting the sampling rate $f_{s1}$ of the digital band-pass filter 16 to four times the intermediate frequency $f_0$. Further, it is possible to implement the digital multipliers 24, 25, 26, 202 via simple configurations shown in FIGS. 4 and 5, by making it possible to approximate the multiplicand attributes a1, a2, b0, b2 by using exponentiation multiples of 2.

Further, it is possible to approximate the multiplicand attributes a1, a2, b0 of the digital multipliers 31, 32, 33 in the filters 17a through 17c shown in FIG. 6 by using exponentiation multiples of 2 by setting the sampling rate $f_{s2}$ of the interpolation filter 17 to 16 times the intermediate frequency $f_c$. Further, it is possible to implement the digital multipliers 31, 32, 33 via simple configurations shown in FIGS. 7 through 9, by making it possible to approximate the multiplicand attributes a1, a2, b0 by using exponentiation multiples of 2.

It is necessary to process waves at a high sampling rate in order for the digital detection circuit to perform high-accuracy detection. In case an IIR filter 1' in a general configuration is used instead of the digital band-pass filter 16 and the interpolation filter 17 to the IIR filter 1' is operated at a high sampling rate, the corresponding digital band-pass filter 1' must be configured by a large-scale digital circuit, as described in terms of the related art.

According to the invention, the circuit scale is simplified by operating the digital band-pass filter 16 at the sampling rate $f_{s1}$ four times the intermediate frequency $f_c$ (low sampling rate). The interpolation filter 17 is operated at the sampling rate $f_{s2}$ 16 times the intermediate frequency $f_c$ (high sampling rate) and the resulting data $D_{LF}$ of the high sampling rate is supplied to the digital detection circuit 18. Thus, the circuit scale can be simplified compared with the IIR filter 1' in a general configuration shown in FIG. 15 as well as high-accuracy detection is allowed.

While the foregoing description assumes a case where the digital multipliers 24, 25, 26, 202, 31, 32, 33 are configured by decoder circuits as shown in FIGS. 4, 5, 7, 8 and 9, the invention is not limited to such a configuration. Digital multipliers 24, 25, 26, 202, 31, 32, 33 may be configured via binary shift registers that allow bit shift operation.

While the AM receiver is addressed in this embodiment, the invention can be applied to other receivers such as FM receivers.

[Advantages of the Invention]

As mentioned earlier, a receiver according to the invention comprises a digital band-pass filter for performing digital filtering on the digital data at a first sampling rate equal to an exponentiation multiple of 2 of the intermediate frequency and a digital interpolation filter for performing digital filtering on the data output from the digital band-pass filter at a second sampling rate equal to an exponentiation multiple of 2 of the intermediate frequency. This simplifies the overall circuit scale and upgrades the detection accuracy in detection section as the same time, thus providing excellent effects in digitization of receivers.

[FIG. 1]

A: Frequency converter
B: Mixer
C: Local oscillator
D: Digital detection output
16: Digital BPF
17: Interpolation filter
18: Digital detection circuit

[FIG. 4]

A: Input D23
B: Output D24

[FIG. 5]

A: Input D19 (D23)
B: Output D25 (D26)

[FIG. 7]

A: Input D29
B: Adder
C: Output D31

[FIG. 8]

A: Input D30
B: Output D32

[FIG. 9]

A: Input D27
B: Output DLF1

[FIG. 10]

A: Gain (dB)
B: Frequency

[FIG. 11]

A: Gain (dB)
B: Single stage
C: Three stages
D: Frequency

[FIG. 12]

A: Gain (dB)
B: Frequency

[FIG. 13A]

A: Carrier wave
B: (Phases match between the carrier wave and the sampling points.)

[FIG. 13B]

A: Carrier wave
B: (Phases are dislocated from each other between the carrier wave and the sampling points.)

[FIG. 14]

A: IF signal from a frequency converter
B: Detection output
1: Center frequency band-pass filter
2: Detection circuit

[FIG. 15]

A: IF signal
B: To digital detection circuit

What is claimed is:

1. A receiver comprising digital signal processing means for transmitting data corresponding to a desired frequency component from digital data in the intermediate frequency band to output the data to detection means, wherein
said digital signal processing means comprises:
a digital band-pass filter for performing digital filtering on the digital data at a first sampling rate equal to first exponentiation multiple of 2 of the intermediate frequency and an interpolation filter including a digital low pass filter for performing digital filtering on the data output from said digital band-pass filter at a second sampling rate equal to second exponentiation multiple of 2 of the intermediate frequency, the second sampling rate higher than the first sampling rate, and wherein the output data of said interpolation filter is output to said detection means.

2. The receiver according to claim 1, wherein the first sampling rate is set to four times the intermediate frequency, and said digital band-pass filter includes an IIR filter whose multiplicand attribute is set to the value of an exponentiation multiple of 2.

3. The receiver according to claim 1, wherein the second sampling rate is set to 16 times the intermediate frequency, and said interpolation filter includes an IIR filter whose multiplicand attribute is set to the value of an exponentiation multiple of 2.

4. The receiver according to claim 1, wherein said digital band-pass filter comprises:
 a first, a second, and a third digital adders,
 a first, a second, and a third digital multipliers, and
 a digital delay element having a delay time twice that for the first sampling rate, said first digital adder subtracts output data of said second digital adder from the digital data output from analog-to-digital conversion means, said digital delay element delays output data of said first digital adder, said first digital multiplier multiplies output data of said digital delay element by a first predetermined multiplicand attribute, said second digital adder subtracts output data of said first digital multiplier from output data of said digital delay element, said second digital multiplier multiplies output data of said first digital adder by a second predetermined multiplicand attribute, said third digital multiplier multiplies output data of said digital delay element by a second predetermined multiplicand attribute, and said third digital adder subtracts output data of said third digital multiplier from output data of said second digital multiplier and outputs the subtraction results to said interpolation filter.

5. The receiver according to claim 1, wherein said digital band-pass filter comprises:
a first filter means includes;
 a first, a second, a third, and a fourth digital adders,
 a first, a second, a third, and a fourth digital multipliers, and
 a first and a second digital delay elements serially connected, said elements having a delay time equal to that for the first sampling rate, and a second filter means includes;
 a fifth, a sixth, a seventh, and an eighth digital adders,
 a fifth, a sixth, a seventh, and an eighth digital multipliers, and
 a third and a fourth digital delay elements serially connected, said elements having a delay time equal to that for the first sampling rate, said first digital adder subtracts output data of said second digital adder from the digital data output from said analog-to-digital conversion means, said first digital delay element delays output data of said first digital adder, said second digital delay element delays output data of said first digital delay element, said first digital multiplier multiplies output data of said first digital delay element by a first predetermined multiplicand attribute, said second digital adder subtracts output data of said third digital adder from output data of said first digital multiplier, said second digital multiplier multiplies output data of said second digital delay element by a second predetermined multiplicand attribute, said third digital adder subtracts output data of said third digital multiplier from output data of said second digital delay element, said third digital multiplier multiplies output data of said first digital adder by a third predetermined multiplicand attribute, said fourth digital multiplier multiplies output data of said second digital delay element by a second predetermined multiplicand attribute, said fourth digital adder subtracts output data of said fourth digital multiplier from output data of said third digital multiplier, said fifth digital adder adds output data of said sixth digital adder to output data of said fourth digital multiplier, said third digital delay element delays output data of said fifth digital adder, said fourth digital delay element delays output data of said third digital delay element, said fifth digital multiplier multiplies output data of said third digital delay element by a first predetermined multiplicand attribute, said sixth digital adder subtracts output data of said fifth digital multiplier from output data of said seventh digital adder, said sixth digital multiplier multiplies output data of said fourth digital delay element by a second predetermined multiplicand attribute, said seventh digital adder subtracts output data of said sixth digital multiplier from output data of said fourth digital delay element, said third digital multiplier multiplies output data of said fifth digital adder by a seventh predetermined multiplicand attribute, said eighth digital multiplier multiplies output data of said fourth digital delay element by a second predetermined multiplicand attribute, and said eighth digital adder subtracts output data of said eighth digital multiplier from output data of said seventh digital multiplier and outputs the subtraction results to said interpolation filter.

6. The receiver according to claim 1, wherein said interpolation filter comprises:
a low pass filter means including;
 a ninth, and a tenth digital adders,
 a ninth, a tenth, and an eleventh digital multipliers, and
 a fifth, and a sixth digital delay elements serially connected, said elements having a delay time equal to that for the second sampling rate, said ninth digital adder adds data supplied from said digital band-pass filter and output data of said tenth digital adder, said fifth digital delay element delays output data of said ninth digital adder, said sixth digital delay element delays output data of said fifth digital delay element, said ninth digital multiplier multiplies output data of said fifth digital delay element by a ninth predetermined multiplicand attribute, said tenth digital adder subtracts output data of said tenth digital multiplier from output data of said ninth digital multiplier, said tenth digital multiplier multiplies output data of said sixth digital delay element by a tenth predetermined multiplicand attribute, and said eleventh digital multiplier multiplies output data of said ninth digital delay element by an eleventh predetermined multiplicand attribute and outputs the multiplication results to said detection means.

7. The receiver according to claim 1, wherein said interpolation filter includes a plurality of said low pass filter means serially connected.

8. The receiver according to claim 6, wherein the ninth and the eleventh multiplicand attributes of said ninth and said eleventh digital multiplier are set to $2^{-2}$, and the tenth multiplicand attribute of said tenth digital multiplier are set to $2^{-1}$.

9. A receiver comprising digital signal processing section for transmitting data corresponding to a desired frequency component from digital data in the intermediate frequency band to output the data to detection section, wherein said digital signal processing section comprises:

a digital band-pass filter for performing digital filtering on the digital data at a first sampling rate equal to a first exponentiation multiple of 2 of the intermediate frequency and an interpolation filter including a digital low pass filter for performing digital filtering on the data output from said digital band-pass filter at a second sampling rate equal to a second exponentiation multiple of 2 of the intermediate frequency, the second sampling rate higher than the first sampling rate, and wherein the output data of said interpolation filter is output to said detection section.

10. The receiver according to claim 9, wherein the first sampling rate is set to four times the intermediate frequency, and said digital band-pass filter includes an IIR filter whose multiplicand attribute is set to the value of an exponentiation multiple of 2.

11. The receiver according to claim 9, wherein the second sampling rate is set to 16 times the intermediate frequency, and said interpolation filter includes an IIR filter whose multiplicand attribute is set to the value of an exponentiation multiple of 2.

12. The receiver according to claim 9, wherein said digital band-pass filter comprises:

a first, a second, and a third digital adders, a first, a second, and a third digital multipliers, and a digital delay element having a delay time twice that for the first sampling rate, said first digital adder subtracts output data of said second digital adder from the digital data output from analog-to-digital conversion section, said digital delay element delays output data of said first digital adder, said first digital multiplier multiplies output data of said digital delay element by a first predetermined multiplicand attribute, said second digital adder subtracts output data of said first digital multiplier from output data of said digital delay element, said second digital multiplier multiplies output data of said first digital adder by a second predetermined multiplicand attribute, said third digital multiplier multiplies output data of said digital delay element by a second predetermined multiplicand attribute, and said third digital adder subtracts output data of said third digital multiplier from output data of said second digital multiplier and outputs the subtraction results to said interpolation filter.

13. The receiver according to claim 9, wherein said digital band-pass filter comprises:

a first filter section includes;
    a first, a second, a third, and a fourth digital adders,
    a first, a second, a third, and a fourth digital multipliers, and
    a first and a second digital delay elements serially connected, said elements having a delay time equal to that for the first sampling rate, and a second filter section includes;
    a fifth, a sixth, a seventh, and an eighth digital adders,
    a fifth, a sixth, a seventh, and an eighth digital multipliers, and
    a third and a fourth digital delay elements serially connected, said elements having a delay time equal to that for the first sampling rate, said first digital adder subtracts output data of said second digital adder from the digital data output from said analog-to-digital conversion section, said first digital delay element delays output data of said first digital adder, said second digital delay element delays output data of said first digital delay element, said first digital multiplier multiplies output data of said first digital delay element by a first predetermined multiplicand attribute, said second digital adder subtracts output data of said third digital adder from output data of said first digital multiplier, said second digital multiplier multiplies output data of said second digital delay element by a second predetermined multiplicand attribute, said third digital adder subtracts output data of said third digital multiplier from output data of said second digital delay element, said third digital multiplier multiplies output data of said first digital adder by a third predetermined multiplicand attribute, said fourth digital multiplier multiplies output data of said second digital delay element by a second predetermined multiplicand attribute, said fourth digital adder subtracts output data of said fourth digital multiplier from output data of said third digital multiplier, said fifth digital adder adds output data of said sixth digital adder to output data of said fourth digital multiplier, said third digital delay element delays output data of said fifth digital adder, said fourth digital delay element delays output data of said third digital delay element, said fifth digital multiplier multiplies output data of said third digital delay element by a first predetermined multiplicand attribute, said sixth digital adder subtracts output data of said fifth digital multiplier from output data of said seventh digital adder, said sixth digital multiplier multiplies output data of said fourth digital delay element by a second predetermined multiplicand attribute, said seventh digital adder subtracts output data of said sixth digital multiplier from output data of said fourth digital delay element, said third digital multiplier multiplies output data of said fifth digital adder by a seventh predetermined multiplicand attribute, said eighth digital multiplier multiplies output data of said fourth digital delay element by a second predetermined multiplicand attribute, and said eighth digital adder subtracts output data of said eighth digital multiplier from output data of said seventh digital multiplier and outputs the subtraction results to said interpolation filter.

14. The receiver according to claim 9, wherein said interpolation filter comprises:

a low pass filter section including;
  a ninth, and a tenth digital adders,
  a ninth, a tenth, and an eleventh digital multipliers, and
  a fifth, and a sixth digital delay elements serially connected, said elements having a delay time equal to that for the second sampling rate, said ninth digital adder adds data supplied from said digital band-pass filter and output data of said tenth digital adder, said fifth digital delay element delays output data of said ninth digital adder, said sixth digital delay element delays output data of said fifth digital delay element, said ninth digital multiplier multiplies output data of said fifth digital delay element by a ninth predetermined multiplicand attribute, said tenth digital adder subtracts output data of said tenth digital multiplier from output data of said ninth digital multiplier, said tenth digital multiplier multiplies output data of said sixth digital delay element by a tenth predetermined multiplicand attribute, and said eleventh digital multiplier multiplies output data of said ninth digital delay element by an eleventh predetermined multiplicand attribute and outputs the multiplication results to said detection section.

15. The receiver according to claim 14, wherein said interpolation filter includes a plurality of said low pass filter section serially connected.

16. The receiver according to claim 14, wherein the ninth and the eleventh multiplicand attributes of said ninth and said eleventh digital multiplier are set to $2^{-2}$, and the tenth multiplicand attribute of said tenth digital multiplier are set to $2^{-1}$.

17. A circuit which outputs data corresponding to a first frequency component from digital data in a frequency band and which comprises:

a first digital filter circuit that digitally filters the digital data at a first sampling rate equal to $2^x$ times the first frequency to produce first sampled data; and a second digital filter circuit that digitally filters the first sampled data at a second sampling rate equal to $2^y$ times the first frequency to produce second sampled data, wherein x and y are integers, and wherein the second sampling rate higher is higher than the first sampling rate.

18. The circuit according to claim 17, wherein x equals two.

19. The circuit according to claim 17, wherein y equals four.

20. The circuit according to claim 18, wherein y equals four.

21. The circuit according to claim 17, wherein said first digital filter circuit comprises an IIR filter whose multiplicand attribute equals $2^a$, wherein a is an integer.

22. The circuit according to claim 17, wherein said second digital filter circuit includes an IIR filter whose multiplicand attribute equals $2^b$, wherein b is an integer.

23. The circuit according to claim 21, wherein said second digital filter circuit includes an IIR filter whose multiplicand attribute equals $2^b$, wherein b is an integer.

24. The circuit according to claim 23, wherein x equals two and y equals four.

25. The circuit according to claim 17, wherein the frequency band is in an intermediate frequency band.

26. The circuit according to claim 17, wherein said first digital filter circuit comprises a digital band pass filter, wherein said second digital filter circuit comprises a digital low pass filter, wherein said digital low pass filter constitutes at least part of an interpolation filter circuit and outputs said second sampled data to a digital detection circuit, and wherein said digital detection circuit outputs a digital detection signal based on second sampled data.

* * * * *